(12) United States Patent
Korchemny

(10) Patent No.: US 12,717,997 B2
(45) Date of Patent: Aug. 25, 2026

(54) EXTENDED REGULAR EXPRESSION MATCHING IN A DIRECTED ACYCLIC GRAPH BY USING ASSERTION SIMULATION

(71) Applicant: Synopsys, Inc., Mountain View, CA (US)

(72) Inventor: Dmitry Korchemny, Kfar Saba (IL)

(73) Assignee: Synopsys, Inc., Sunnyvale, CA (US)

( * ) Notice: Subject to any disclaimer, the term of this patent is extended or adjusted under 35 U.S.C. 154(b) by 811 days.

(21) Appl. No.: 18/068,371

(22) Filed: Dec. 19, 2022

(65) Prior Publication Data

US 2023/0214574 A1 Jul. 6, 2023

Related U.S. Application Data

(60) Provisional application No. 63/296,061, filed on Jan. 3, 2022.

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ............................ G06F 30/398; G06F 30/392
USPC ........................................................ 716/111
See application file for complete search history.

(56) References Cited

U.S. PATENT DOCUMENTS 8,984,461 B1 * 3/2015 Ip ............................ G06F 30/33 716/132
10,262,077 B2 * 4/2019 Infante-Lopez .... G06F 16/9024
10,380,301 B1 * 8/2019 Goyal ................. G06F 30/3323
10,515,169 B1 * 12/2019 Spatafore ............ G06F 30/3323
11,036,906 B1 * 6/2021 Chhabra ............... G06F 30/398
2014/0282315 A1 * 9/2014 Wakefield ............... G06F 30/39 716/106
2015/0379158 A1 * 12/2015 Infante-Lopez .... G06F 16/9024 707/798
2019/0278884 A1 * 9/2019 Surisetty ................. G06F 30/30

* cited by examiner

*Primary Examiner* — Suchin Parihar
(74) *Attorney, Agent, or Firm* — Laxman Sahasrabuddhe; Park, Vaughan, Fleming & Dowler LLP

(57) ABSTRACT

A directed acyclic graph (DAG) and an extended regular expression (ERE) may be received. A circuit design may be generated based on the DAG. A cover property may be generated based on the ERE. The circuit design may be simulated. A first result may be determined based on whether the cover property is satisfied during the simulating the circuit design. It may be determined whether the ERE matches a path in the DAG based on the first result.

20 Claims, 12 Drawing Sheets

EXTENDED REGULAR EXPRESSION MATCHING IN A DIRECTED ACYCLIC GRAPH BY USING ASSERTION SIMULATION

RELATED APPLICATION

This application claims the benefit of U.S. Provisional Application Ser. No. 63/296,061, filed on 3 Jan. 2022, the contents of which are herein incorporated by reference in their entirety for all purposes.

TECHNICAL FIELD

The present disclosure relates to extended regular expression (ERE) matching in a directed acyclic graph (DAG). More specifically, the present disclosure relates to ERE matching in a DAG by using assertion simulation.

BACKGROUND

The importance of verifying and/or testing systems, which may include, but are not limited to integrated circuit (IC) designs, cannot be over emphasized. Indeed, it would be impossible to use systems in mission critical tasks if the systems had not been thoroughly verified and tested. DAGs may be used for solving many technological problems, which may include, but are not limited to, technological problems that arise during system verification and/or testing.

SUMMARY

A DAG and an ERE may be received. A circuit design may be generated based on the DAG. A cover property (which is a type of logical statement or assertion) may be generated based on the ERE. The circuit design may be simulated. A first result may be determined based on whether the cover property is satisfied during the simulation of the circuit design. It may be determined whether the ERE matches a path in the DAG based on the first result. The DAG may include a set of vertices and a set of directed edges, where each directed edge in the set of directed edges may connect two vertices in the set of vertices, and where each vertex in the set of vertices may be associated with a letter selected from a set of letters. The ERE may specify a set of sequences of letters selected from the set of letters.

In some embodiments described herein, generating the cover property based on the ERE may include creating a logical statement which is defined over a set of signals corresponding to the set of letters, where the logical statement evaluates to a true value when a signal trace corresponding to a sequence of letters in the set of sequences of letters is detected during the simulation of the circuit design.

In some embodiments described herein, generating the circuit design based on the DAG may include associating a set of identifiers with the set of vertices based on a topological sorting of the set of vertices in the DAG, and creating a vector of signals in the circuit design, where the vector of signals is indexed by the set of identifiers, and where signal values of the vector of signals correspond to the set of letters. In some embodiments, a clock may be created in the circuit design, a counter may be created, where a value of the counter may be incremented at each clock edge of the clock.

In some embodiments described herein, simulation of the circuit design generates signal traces which correspond to sequences of letters along paths in the DAG.

In some embodiments described herein, the ERE may be transformed to improve performance of the simulation of the circuit design.

In some embodiments described herein, the DAG may represent one or more sets of scenarios which were generated for verifying or testing a system, and the ERE may represent a set of scenarios which is desired to be covered for verifying or testing the system.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Aspects of the present disclosure relate to ERE matching in a DAG by using assertion simulation. A DAG may include a set of vertices which are connected by a set of edges, and an ERE may specify a set of paths, where each path may be a sequence of vertices. DAGs and EREs may be used to represent and solve technological problems. For example, the aspects of a system which are exercised during a verification and/or testing run may be represented using a DAG, and the aspects of the system that are desired to be exercised during verification and/or testing may be represented using an ERE. Determining whether the aspects of the system that are desired to be exercised were actually exercised during the verification and/or testing run is an important technological problem which may be solved by using ERE matching in the DAG.

The problem of ERE matching in a DAG may be formally defined as follows. Suppose, DAG G and an ERE R are given, where DAG G includes vertices which are labeled with letters from a finite alphabet E (which may be a set of symbols or letters), and ERE R is defined over the finite alphabet E. A path in DAG G corresponds to a sequence of letters because the path corresponds to a sequence of vertices and each vertex is associated with a letter (i.e., the label). The ERE R is a pattern for a set of paths in a graph. In the problem of ERE matching in a DAG, the task is to find whether R can be matched on graph G, i.e., whether the set of paths defined by the ERE R is not empty in graph G.

Some conventional approaches may be complex and error prone and may only work for conventional regular expressions, i.e., these conventional approaches may not handle EREs. Embodiments described herein allow handling of any ERE by reduction to SystemVerilog Assertions (SVA) checking in circuit simulation and avoid a complex and error-prone implementation of ERE matching in a DAG.

Technological advantages of the present disclosure include, but are not limited to, (1) reduction of the ERE matching in a DAG problem to a regular expression matching in circuit simulation, (2) checking path coverage in a DAG by using SVA checking in circuit simulation (which allows delegating the semantic and syntactic checking complexity to the circuit simulator), (3) DAG size reduction for common EREs to improve ERE matching performance, and (4) matching ERE on multiple DAGs in a single circuit simulation run.

Figure 1:
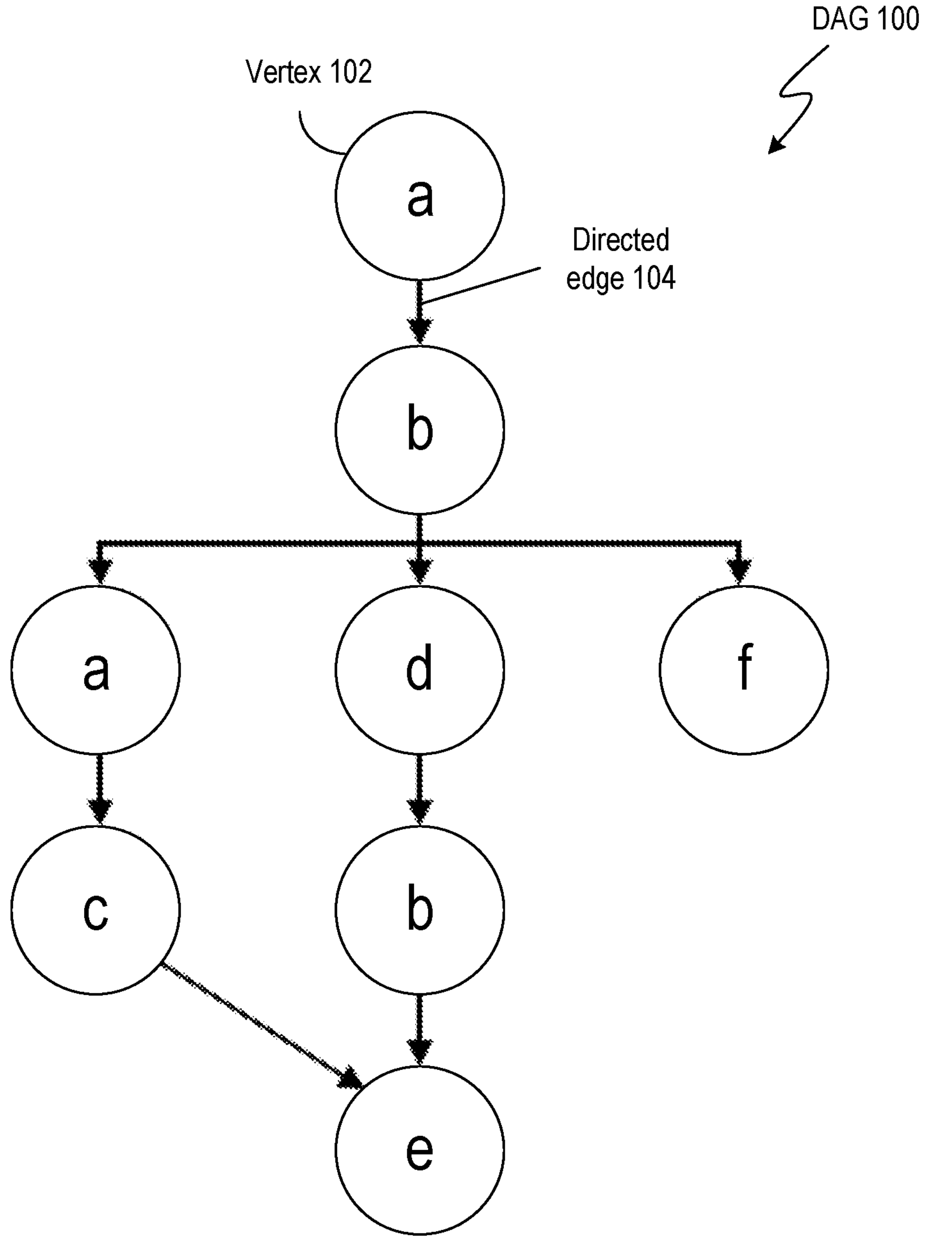
FIG. 1 illustrates a labeled DAG in accordance with some embodiments described herein.

FIG. 1 illustrates a labeled DAG in accordance with some embodiments described herein.

DAG 100 may include a set of vertices (e.g., vertex 102) which are connected by a set of directed edges (e.g., directed edge 104). Each vertex may be associated with a labeled, e.g., vertex 102 is associated with the label "a."

Consider the following extended regular expressions:

1. ab—there is a path of length 2, with the first vertex labeled a and the second vertex labeled b;
2. ad—there is path of length 2, with the first vertex labeled a and the second vertex labeled d;
3. a. d—there is a path of length 3, starting with a vertex labeled a and ending with a vertex labeled d;
4. a.*d—there is a path starting with a vertex labeled a and ending with a vertex d;
5. b (d|f)—there is path of length 2 with the first vertex labeled b, and the second vertex labeled either d or f;
6. fj (ac, db)—there are two parallel paths labeled ac and db having the same predecessor and the same successor;
7. fj (.*a.*,.*b.*)—there are vertices labeled a and b belonging to parallel paths;
8. b\fj (a.*, d.*)\e—b is a fork point of two parallel branches starting with vertices labeled a and d, correspondingly, and converging at a vertex labeled e.
9. (.*a.*)×(.*b.*)—there is a path going through vertices labeled a and b in any order;
10. (.*a.*)×(.*b.*)—there are vertices labeled with a and b with no limitation imposed.

ERE (2) shown above does not have a match on DAG 100, but all other EREs do. Specifically, no path in DAG 100 corresponds to the label sequence "a" followed by the label "d."

In general, any technological problem that can be reduced to the problem of ERE matching in a DAG may use embodiments described herein. For example, embodiments described herein may be used during verification and/or testing in IC design flow. It is important to ensure that a verification or testing of an IC design covers different aspects over which an IC design is desired to be verified and/or tested. For this purpose, a model may be created for an IC design's behavior. For example, the model may be specified using the Portable Test and Stimulus Standard (PSS). Examples described herein may use PSS models for illustrative purposes, but the scope of the disclosure is generally applicable to any technique for modeling system behavior.

Once the behavior of an IC design (or generally any system) is specified using a PSS model, the PSS model may be used to generate test cases and analyze test runs for different embodiments or representations of the IC design, which may include, but are not limited to, simulation, emulation, FPGA prototyping, and post-silicon validation. One application of ERE matching on a DAG is in checking scenario generation quality using a PSS model.

A PSS model may include actions, their attributes and objects. Actions may represent operations performed by the underlying IC design and test environment. Actions may be scheduled sequentially, in parallel, or in various combinations based on conditional evaluation, looping, or randomization constructs. Objects may represent passive entities which are used by the actions. Examples of objects include, but are not limited to, resources, states, and data-flow items.

A scenario may refer to a particular instantiation of a PSS model. A scenario may include of a set of action instances, their attributes and object instances, as well as scheduling constraints and rules defining the relationships between them. The scheduling rules may define a dependency relation over the included actions, which may determine the execution semantics.

A PSS model may define a scenario space, i.e., a set of possible scenarios. Given a set of scenarios, it may be desirable to check if the set of scenarios covers a desired portion of the scenario space. A set of scenarios may be represented by a set of DAGs, and the desired portion of the scenario space may be represented by a set of EREs. Thus, the problem of determining if a given set of scenarios covers a desired portion of the scenario space may be reduced to the problem of ERE matching in a DAG.

Specifically, suppose DAG 100 in FIG. 1 corresponds to a set of scenarios that are verified and/or tested, and the above-mentioned EREs (1)-(10) represent the set of scenarios that are desired to be verified and/or tested. The problem of determining if the scenarios that are verified and/or tested cover the scenarios that are desired to be verified and/or tested may be reduced to the problem of matching the above-mentioned EREs in DAG 100. It may be determined that ERE (2) was not matched by a corresponding path in DAG 100. Thus, it may be determined that the scenarios that were verified and/or tested do not fully cover the scenarios that are desired to be verified and/or tested.

Figure 2:
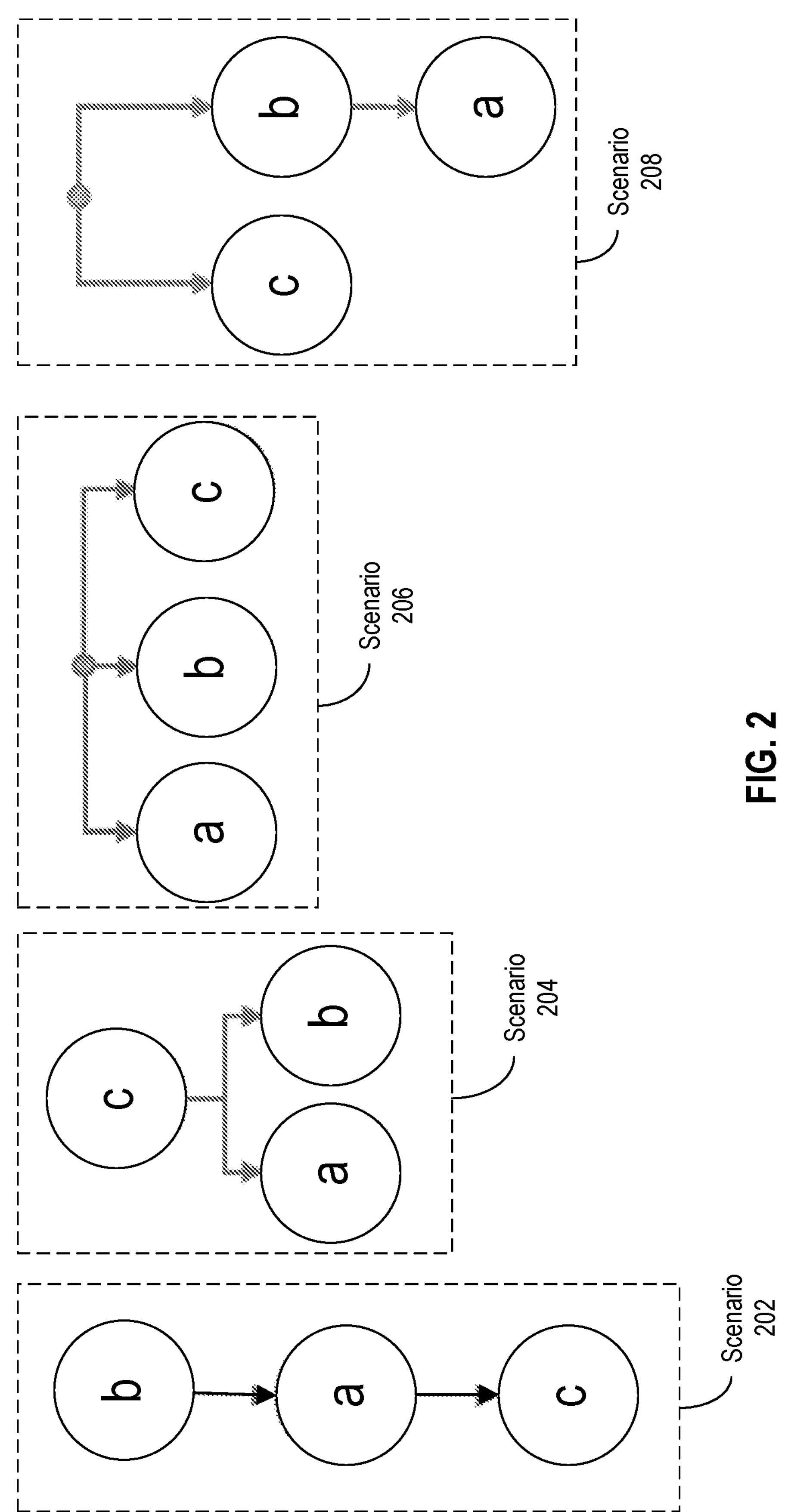
FIG. 2 illustrates a set of generated scenarios in accordance with some embodiments described herein.

FIG. 2 illustrates a set of generated scenarios in accordance with some embodiments described herein.

Consider the following PSS specification fragment "schedule {a; b; c;}", which states that the actions a, b, c may be executed in any order. Scenarios 202, 204, 206, and 208 may be generated based on the PSS specification fragment. Each scenario in FIG. 2 is represented using a DAG, where each vertex corresponds to an action, and each directed edge corresponds to an execution dependency. For example, in scenario 202 action "a" is performed, followed by action "b," and then action "c", whereas in scenario 206 actions "a," "b," and "c" are performed in parallel, and so forth.

A set of EREs may be used to specify the set of scenarios that are desired to be covered. A set of DAGs may be used to specify the generated scenarios (e.g., the DAGs shown in FIG. 2 which represent scenarios 202, 204, 206, 208). A process for ERE matching in DAG may be used to determine whether the scenarios that are desired to be covered are actually covered by the generated scenarios. A first set of scenarios may be covered by a second set of scenarios if each scenario in the first set of scenarios is in the second set of scenarios. For example, ERE ba matches scenarios 202 and 208, ERE c\fj(a, b) matches scenario 204, but ERE fj(a, bc) does not match any scenario. The symbol "r represents the fusion operation, and the notation "fj" represents the fork join operation. Detailed explanations of these ERE operators are provided below.

Some embodiments described herein perform ERE matching in a DAG by using a conventional Hardware Description Language (HDL) simulator supporting a regular linear time language (RLTL), for example, by a SystemVerilog (IEEE, 2017) simulator. SystemVerilog language has means to specify assertions—SystemVerilog Assertions (SVA), which is an RLTL language. SVA syntax allows specifying regular expressions on linear traces, i.e., sequences of signal values in time. For example, the expression "a ##1 b" specifies that at some time instance signal a is high (has a value of 1) and in the following time instance, signal b is high. The expression "a[*5]" specifies that signal a is high during five consecutive time instances. Some embodiments described herein may reduce the problem of ERE matching in a DAG to SVA checking in circuit simulation.

Approaches for matching conventional (non-extended) regular expressions on DAGs may not handle EREs. Embodiments described herein allow handling of any ERE by reduction to SVA checking in circuit simulation. Embodiments described herein avoid a complex and error-prone direct implementation. Additionally, the actions (i.e., labels) in a PSS may be defined by expressions involving their action names and attributes. For example, it may be possible to look for an action whose attribute attrl value is greater than 5 and its attribute attr2 be either 2 or 3. For such a specification, the resulting SystemVerilog expression may be complex, e.g., "v.attr1>5 && v.attr2 inside '{2,3},'" where v is a DAG vertex. It may be difficult to interpret such expressions directly because of the complexity of SystemVerilog syntax and semantics, whereas reducing ERE matching in DAG to SVA checking in circuit simulation may delegate such expression evaluation to the circuit simulator.

Advantages of embodiments described herein include, but are not limited to, (1) reduction of the ERE matching in a DAG problem to a regular expression matching in HDL simulation, for example to SVA checking in circuit simulation, (2) checking path coverage in PSS-generated scenarios by using SVA checking in circuit simulation (which allows delegating the semantic and syntactic checking complexity to the circuit simulator), (3) DAG size reduction for common EREs to improve ERE matching performance, and (4) matching ERE on multiple DAGs in a single circuit simulation run.

Extended Regular Expression on Directed Acyclic Graph

Alphabet Σ is a finite set of letters, for example Σ={a, b, c, d}. An extended regular expression (ERE) is an expression defined recursively using the rules (1)-(7) shown below, where R and S denote EREs:

1. Empty word Λ;
2. Letter. x ∈Σ;
3. Concatenation: RS;
4. Fusion: R\S;
5. Iteration (Kleene plus): $R^+$;
6. Disjunction: R|S;
7. Sequential intersection: R&S;
8. Fork join: fj (R, S, . . . );
9. General intersection: R×S.

Expressions built using only rules (1)-(6) above are conventional regular expressions. Sometimes, the sequential intersection rule (7) is also considered a regular expression. In this disclosure, it is assumed that the concatenation and fusion operators have the same precedence, and their precedence is higher than the precedence of the disjunction and the intersection operators. Parentheses may be used for disambiguation.

In this disclosure, following expressions may be used as shortcuts:

- Kleene star $R^+$: Λ|$R^+$—occurrence of R zero or more times;
- Dot.: any letter. a|b|c| . . . —a disjunction of all letters from E;
- −x: Any letter but x: a|b|c| . . . —a disjunction of all letters from E excluding x;
- $x^1$: First occurrence of x: (−x)*x;

DAG vertices $v_1$ and $v_2$ are called sequential if there is a path from $v_1$ to $v_2$ or from $v_2$ to $v_1$. For example, vertices "b" and "a" are sequential in scenario 202. Vertices $v_1$ and $v_2$ are called concurrent if there is neither a path from $v_1$ to $v_2$ nor a path from $v_2$ to $v_1$. For example, vertices "b" and "a" are concurrent in scenario 204. Paths $\pi_1$ and $\pi_2$ are called concurrent if all vertices in $\pi_1$ are pairwise concurrent with the vertices in $\pi_2$. For example, scenario 208 includes two paths: a first path that begins at the root node and ends at vertex "c" and a second path that begins at the root node and passes through vertex "b" and ends at vertex "a." In scenario 208, the first path is concurrent with respect to the second path.

FIGS. 3-10 illustrate matching an ERE with a path in a DAG in accordance with some embodiments described herein.

ERE T matches a path π in DAG G labeled with the letters from alphabet Σ, which is written as π⊨ T. Each rule for constructing an ERE may be matched with a portion of a DAG. The following operations for matching EREs in a DAG may be applied recursively. In the following operations, R and S are EREs, π represents a path, and |π| represents the length of path in.

Figures 3, 4, 5, 6, 7:
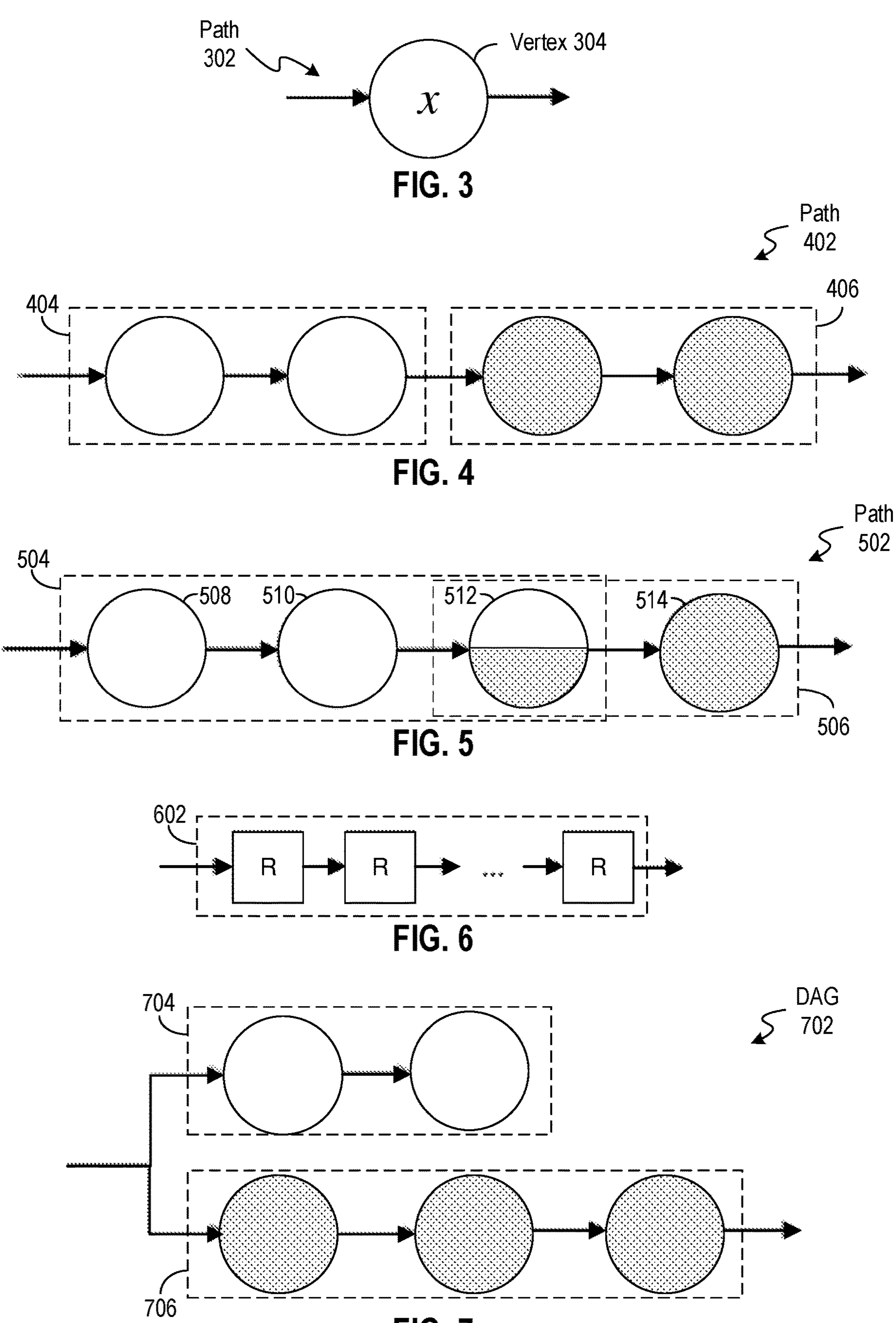
FIGS. 3-10 illustrate matching an ERE with a path in a DAG in accordance with some embodiments described herein.

- π⊨ Λ iff|π|=0, i.e., the empty word matches an empty path. The word "iff" means "if and only if."
- π⊨ x,x ∈Σ iff path π includes a single vertex v and v is labeled with x. If path 302 includes a single vertex 304 which is labeled with x, then path 302 matches the ERE "x".
- π⊨ RS iff π may be subdivided into two (possibly empty) consecutive paths $\pi_1$ and $\pi_2$: $\pi=\pi_1\pi_2$, where $\pi_1$ ⊨ R and $\pi_2$⊨ S. FIG. 4 illustrates a concatenation rule. Path 402 may be subdivided into two consecutive paths 404 and 406. Path 404 may match ERE R, and path 406 may match ERE S. Then, path 402 matches the ERE RS, which is the concatenation of EREs R and S.
- π⊨ R\S iff π may be subdivided into three consecutive paths $\pi_1$, $\pi_2$ and $\pi_3$: $|\pi_2|=$1,$\pi_1\pi_2$ ⊨ R and $\pi_2\pi_3$⊨ S, i.e., ERE S is matched from the point where ERE R has a match. FIG. 5 illustrates the fusion rule. Path 502 may be divided into three consecutive paths $\pi_1$, $\pi_2$ and $\pi_3$, where path $\pi_1$ includes vertices 508 and 510, path $\pi_2$ includes vertex 512, and path $\pi_3$ includes vertices 512 and 514. Path 504 and path 506 include a common vertex 512. If path 504 matches ERE R and path 506 matches path ERE S, then path 502 matches the ERE R\S, which is the fusion of EREs R and S.

$\pi \models R^+$ iff $\pi$ may be subdivided into some number n>0 of consecutive paths: $\pi=\pi_1\pi_2 \ldots \pi_n$, where $\pi_i \models R$, i=1, . . . , n. FIG. 6 illustrates the iteration rule. Path 602 may be subdivided into multiple number of consecutive paths (denoted by "R" in FIG. 6), where each of the consecutive paths matches ERE R. Then path 602 matches R", where "n" is the number of consecutive "R" paths within path 602.

$\pi \models R|S$ iff either $\pi \models R$ or $\pi \models S$, i.e., the path matches either R or S (or both). FIG. 7 illustrates the disjunction rule. DAG 702 includes paths 704 and 706. If path 704 matches R and path 706 matches S, then path 704 matches the ERE R|S and the path 706 matches the ERE R|S.

Figures 8, 9, 10:
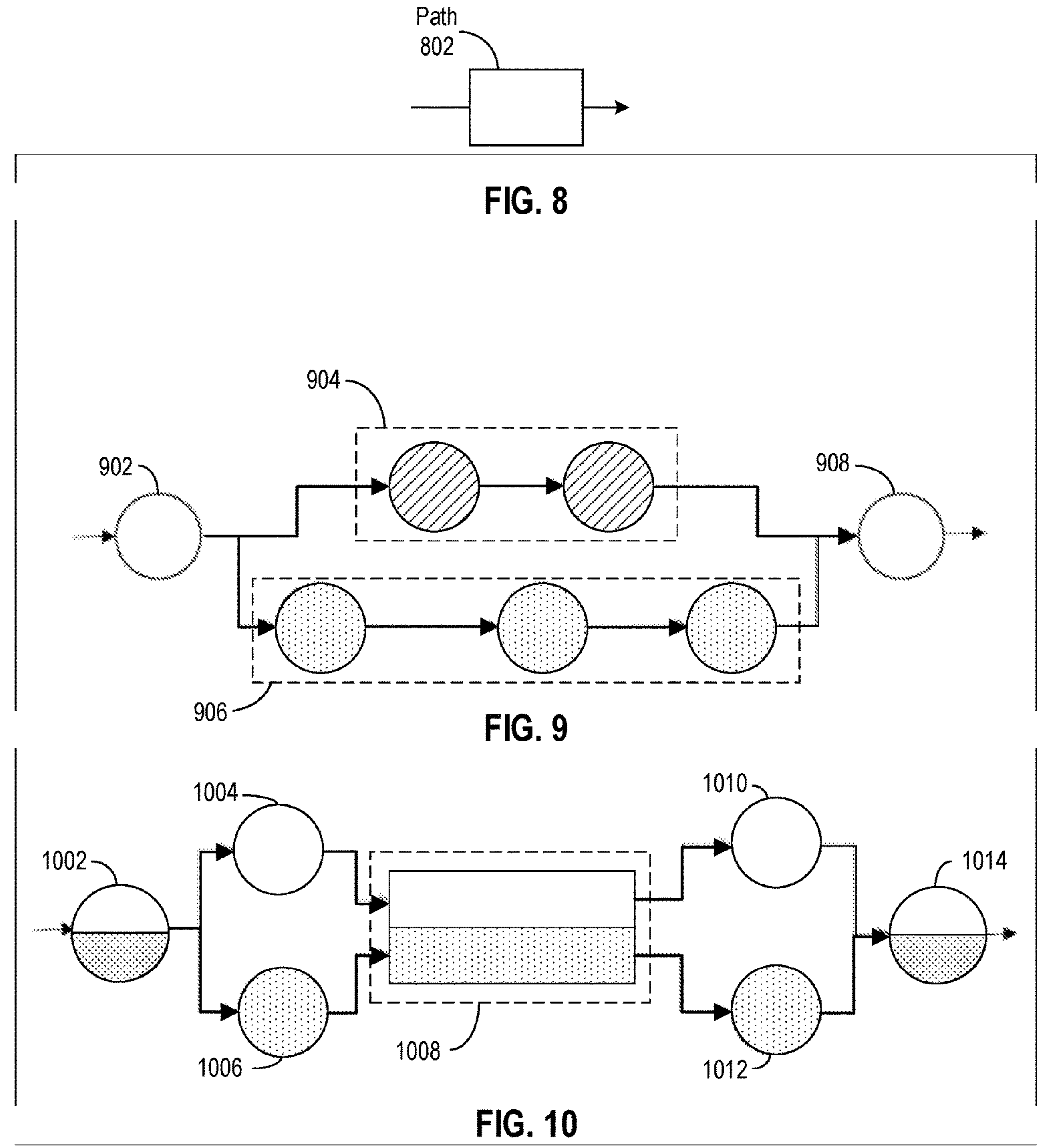

$\pi \models R\&S$ iff $\pi \models R$ and $\pi \models S$, i.e., the path matches both R and S. FIG. 8 illustrates the sequential intersection rule. If path 802 (which may include one or more vertices) matches both R and S, then path 802 matches the ERE R&S.

$\pi \models fj(R_1, R_2, \ldots, R_n)$ iff $\pi=\rho\sigma\tau$, $|\rho|=|\tau|=1$ and there exist paths $\pi_1, \ldots, \pi_n$ such that $\pi_i=\pi\sigma_i\tau$, i=1, . . . , n, and paths $\sigma_1, \ldots, \sigma_n$ are pairwise concurrent and $\sigma_i \models R_i$, i.e., all $R_i$,i=1, . . . , n, belong to parallel branches of the graph. EREs $R_1, R_2, \ldots, R_n$ should not admit an empty match (i.e., the EREs $R_1, R_2, \ldots, R_n$ should not match an empty path). FIG. 9 illustrates the fork join rule. Suppose vertex p corresponds to vertex 902, vertex T corresponds to vertex 908, path 904 (i.e., $0_i$) matches ERE $R_1$, and path 906 (i.e., $\sigma_2$) matches ERE $R_2$, then a first path which passes through vertex 902, path 904, and vertex 908 matches the ERE fj $(R_1, R_2)$, and a second path which passes through vertex 902, path 906, and vertex 908 also matches the ERE fj $(R_1, R_2)$.

$\pi \models R\times S$, where R and S do not admit an empty match, if either $|\pi|=1$ and $\pi \models R$ and $\pi \models S$, or $\pi=\rho\sigma\tau$, $|\rho|=|\tau|=1$ and there exist paths $\pi_1$ and $\pi_2$ such that $\pi_1=\rho\sigma_i\tau$ and $\pi_2=\rho\sigma_2\tau$, i.e., paths matching R and S are convergent and not necessarily concurrent. FIG. 10 illustrates the general intersection rule. Suppose vertex p corresponds to vertex 1002, vertex T corresponds to vertex 1014, path $\pi_1$ corresponds to a path which passes through vertex 1004, path 1008, and vertex 1010, and path $\pi_2$ corresponds to a path which passes through vertex 1006, path 1008, and vertex 1012. Then, a first path from vertex 1002 to vertex 1014 which passes through vertex 1004, path 1008, and vertex 1010 matches the ERE R×S, and a second path from vertex 1002 to vertex 1014 which passes through vertex 1006, path 1008, and vertex 1012 also matches the ERE R×S.

SVA defines sequences built recursively from the following operators ("b" denotes an integral expression interpreted as a Boolean value (true/false), and R and S denote sequences):

Empty sequence: S[*0].
Boolean sequence: b.
Sequence concatenation: R ##1 S.
Infinite repetition: R[*1:$] (or R[+]).
Sequence fusion: R ##0 S.
Sequence disjunction: R or S.
Sequence intersection: R intersect S.

There are numerous derived sequence forms, such as R[*0:$] or R[*], which corresponds to R[*0] or R[*1:$]. SVA sequences correspond to regular expressions defined on linear traces of Boolean signals. SVA allows defining local variables, associated with an evaluation attempt of a sequence, as illustrated in the following example. sequence S;

```
sequence S;
  bit x;
  (start, x = in) ##1 finish[->1] ##0 out == x;
endsequence : S
```

In the above example, when signal start is asserted at the beginning of a transaction, the value of signal in is stored in local variable x. When signal finish is asserted for the first time after start has been asserted, signal out has the same value as signal in in the beginning of the transaction. This value is retrieved from the local variable x.

SVA provides a set of directives, which include, but are not limited to, the cover property, which may have the following format (the SVA definition is broader, but the below definition is sufficient for purposes of this disclosure):

cover property(@(posedge*clk*)disable*iff*(*rst*)*S*), where clk is a signal used as a clock, rst is a reset condition, and S is a sequence. A cover property may be a statement which may evaluate to either a true value or a false value during a circuit simulation. At the end of the circuit simulation, the cover properties that evaluated to a true value during the circuit simulation may be reported. Clause disable iff is optional in the above SVA statement. Directive cover property is successful if sequence S can be matched on the trace at least once. The top-level sequence S must not admit an empty match.

SystemVerilog simulators can check cover property success on signal traces. In this disclosure, SystemVerilog syntax is used wherever appropriate, but the disclosure is generally applicable for any register transfer level (RTL)-based assertion specification language.

Reduction of ERE Checking on DAG to SVA Checking on Trace

DAG Representation

Embodiments described herein may reduce ERE checking on a DAG to SVA checking on a signal trace generated during circuit simulation. The DAG vertices may be sorted in topological order and each vertex may be assigned an identifier which is equal to its position in the sorted list, where the identifiers may begin from a starting value, e.g., 0. If there is a path from a vertex at position i to a vertex at position j then i≤j in any topological order.

Figure 11:
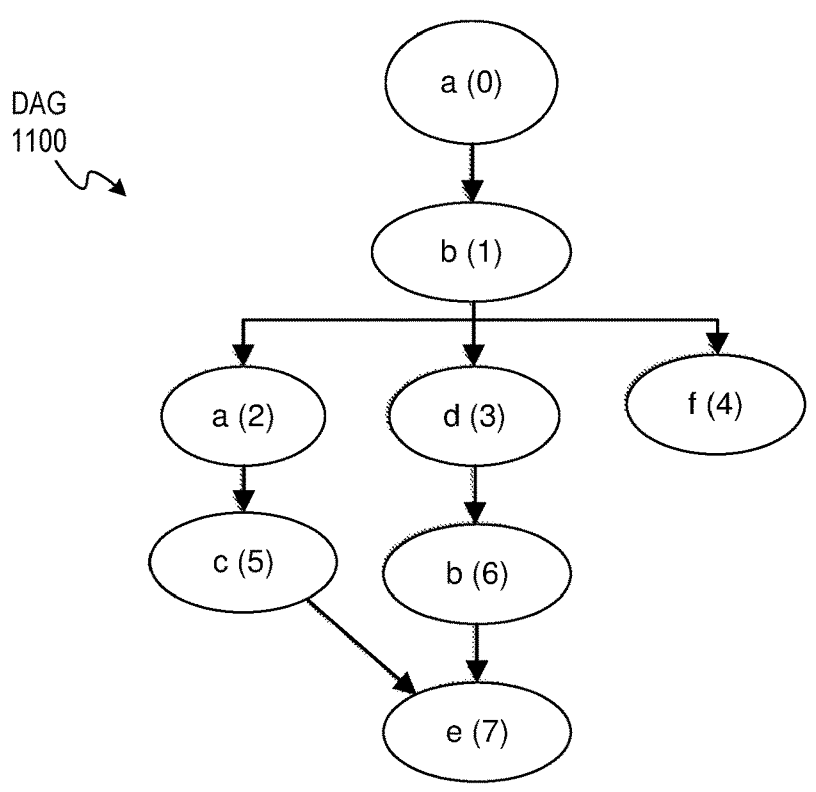
FIG. 11 illustrates a DAG with associated identifiers in accordance with some embodiments described herein.

FIG. 11 illustrates a DAG with associated identifiers in accordance with some embodiments described herein.

The vertices of DAG 1100 shown in FIG. 1 may be sorted and assigned identifiers which are shown in brackets. For example, the vertex with label "a" is assigned the identifier 0, the vertex with label "b" is assigned the identifier 1, and so forth. The identifier assignment shown in FIG. 11 is only one example. Many other identifier assignments for DAG 1100 are possible.

The label type may be defined as a SystemVerilog enumeration, for example, typedef enum{*a*,*b*,*c*,*d*,*e*,*f*}Letters;

To pass over DAG vertices, a clock clk and a counter v may be used, so that v traverses each DAG vertex in the topological order (N is the number of graph nodes):

```
bit clk = 1'b0;
int v = 0;
always #1 clk = !clk;
initial begin
   repeat (N) @(posedge clk) v <= v + 1;
end
```

In other words, the above code shard may be used for traversing each vertex in the DAG in a topological order, i.e., according to the identifier assigned to each vertex.

Reduction Actions

The reduction to SVA may be described in terms of the following actions/functions $\ell$(i)—a label of vertex i. Specifically, a SystemVerilog implementation may declare a vector of labels corresponding to the vertex IDs, such as follows:

```
Letters label[8] = '{a, b, a, d, f, c, b, e};
```

The action/function $\ell$(i) may be implemented as label[i]. In other words, the identifier assigned to a vertex may be used to index into the vector "label," which may return the label (i.e., letters "a" through "f") of the vertex. For example, in FIG. 11, the vertex in DAG 1100 with identifier 4 has label "f" and accordingly the vector element "label[4]" is "f."

The action/function e(i, j) may refer to a Boolean action/function which returns 1 iff there is an edge from vertex i to vertex j. The action/function e(i, j) may be implemented using a graph adjacency matrix.

Figure 12:
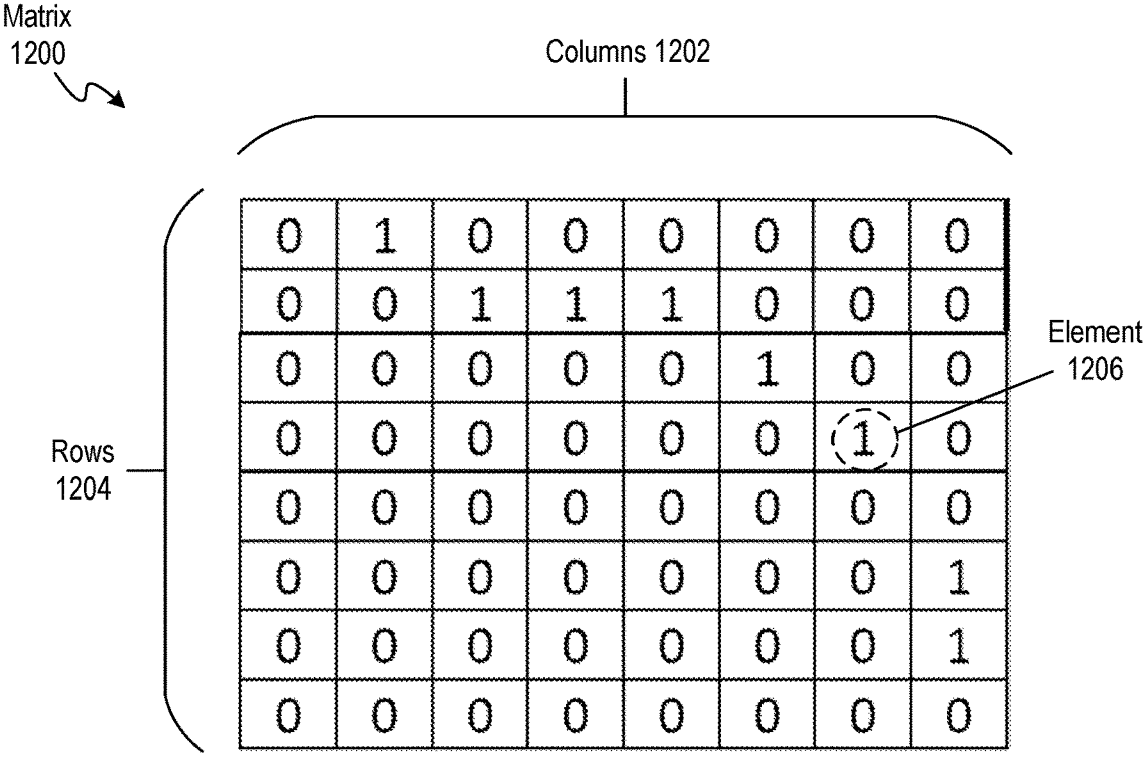
FIG. 12 illustrates how a Boolean function e(i, j) may be implemented using a graph adjacency matrix in accordance with some embodiments described herein.

FIG. 12 illustrates how a Boolean function e(i, j) may be implemented using a graph adjacency matrix in accordance with some embodiments described herein.

The graph adjacency matrix 1200 may correspond to the DAG 1100 shown in FIG. 11 and may include columns 1202 and rows 1204. The number of columns and rows in graph adjacency matrix 1200 is equal to the number of vertices in the corresponding DAG, e.g., DAG 1100. Each element in graph adjacency matrix 1200 may specify whether a directed edge exists between two vertices. A "1" value in row i and column j may specify that a directed edge exists from the vertex with identifier i to the vertex with identifier j. For example, element 1206 has the value "1" and is in row 3 and column 6 (the row and column numbers begin at 0). This corresponds to the edge from vertex with identifier 3 to the vertex with identifier 6 in DAG 1100.

If graph adjacency matrix 1200 is declared as follows:

```
bit [0:7][0:7]adj;
```

then e(i, j) may be implemented as a matrix lookup, e.g., "adj[i][j]." This implementation has been provided for illustration purposes only. Other implementations of function e(i, j) may be used.

The action/function c(i,j) may refer to a Boolean function which returns 1 iff there is a path from vertex i to vertex j.

Figure 13:
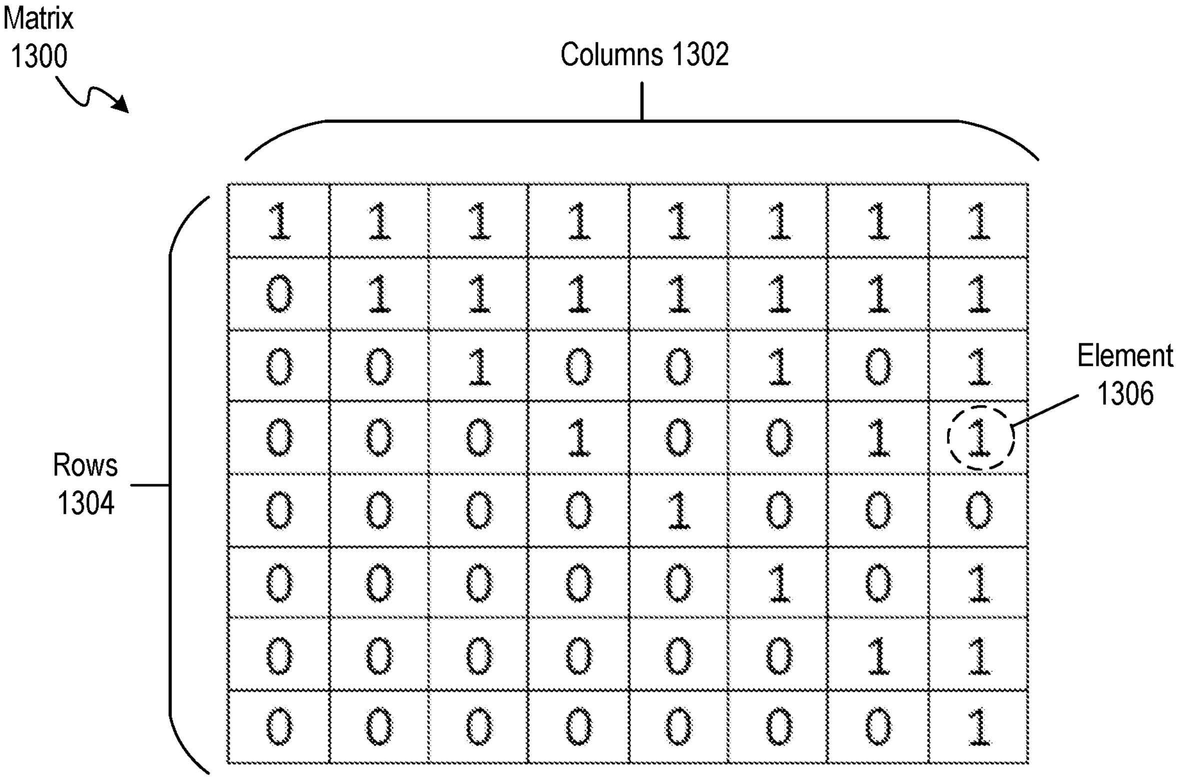
FIG. 13 illustrates how a Boolean function c(i,j) may be implemented using a graph connectivity matrix in accordance with some embodiments described herein.

FIG. 13 illustrates how a Boolean function c(i,j) may be implemented using a graph connectivity matrix in accordance with some embodiments described herein.

The graph connectivity matrix 1300 may correspond to the DAG 1100 shown in FIG. 11 and may include columns 1302 and rows 1304. The number of columns and rows in graph adjacency matrix 1300 is equal to the number of vertices in the corresponding DAG, e.g., DAG 1100. Each element in graph adjacency matrix 1300 may specify whether a path exists between two vertices. A "1" value in row i and column j may specify that a path exists from the vertex with identifier i to the vertex with identifier j. For example, element 1306 has the value "1" and is in row 3 and column 7 (the row and column numbers begin at 0). This corresponds to the path from vertex with identifier 3 to the vertex with identifier 7 in DAG 1100.

If graph connectivity matrix 1300 is declared as follows:

```
bit [0:7][0:7]conn;
```

then c(i,j) may be implemented as a matrix lookup, e.g., "conn[i][j]." This implementation has been provided for illustration purposes only. Other implementation of c(i,j) may be used, for example, some implementations may store only a relevant portion of the matrix in memory.

The action/function $\alpha$(M) may allocate a set M of vertices. This operation may be implemented, for example, by introducing a bit vector local variable of the size of the number of vertexes in the graph, where the bit in position i corresponds to vertex i. For example,

```
sequence T; // Sequence where M is allocated
  bit [7:0] M = '0; // M is initialized with 0
  ...
endsequence : T
```

The symbol $\lambda$ may denote that no set has been allocated for a sequence. The action/function $r$(i, M) may be used to add vertex i in set M. This action may be implemented by setting a corresponding bit of the local variable M to 1. For example, the line of code "M |= (1<<i)" may be used. If M is $\lambda$, then action $r$ is void. The action/function "M⊂L" may refer to a Boolean function which checks if M is a subset of L. For example, this function may be implemented using the line of code "(M & L)==M."

Entry Match Elimination

If the ERE to be matched admits an empty match then it is trivially matched on any graph, so that this case may be excluded from our consideration. However, even if the ERE does not admit an empty match, its subexpression may do so. ERE reduction to SVA may be easier to describe when no subexpressions admit an empty match, because not all SVA operators are appropriate for sequences admitting an empty match. An arbitrary ERE R, which does not admit an empty match, may be equivalently rewritten as ERE $R_1$, where no subexpression of $R_1$ admits an empty match. More generally, if R admits an empty match then it is either equivalent to $\Lambda$, or may be rewritten as $R_1|\Lambda$, where no subexpression of $R_1$ admits an empty match. There may be also a case when an ERE cannot be matched on any graph. Such an ERE may be denoted as $\perp$.

The rewriting transformation $\mathcal{N}$(T) is defined recursively bottom up by the syntactical structure of ERE T. If multiple rewriting rules in the below list are applicable, the first applicable rule should be applied. R and S (R, S≠⊥) below stand for EREs with no subexpression admitting an empty match.

$\mathcal{N}(\perp)=\perp$.

$\mathcal{N}(\Lambda)=\Lambda$.

$\mathcal{N}(x)=x,\ x\in\Sigma$.

$\mathcal{N}(\perp R)=\perp$.

$\mathcal{N}(R\perp)=\perp$.

$\mathcal{N}(\Lambda R)=R$.

$\mathcal{N}(R\Lambda)=R$.

$\mathcal{N}((R|\Lambda)S)=RS|S$.

$\mathcal{N}(R(S|\Lambda))=R|RS$.

$\mathcal{N}(RS)=RS$.
$\mathcal{N}(\bigvee\backslash R)=\bigvee$.
$\mathcal{N}(R\backslash\bigvee)=\bigvee$.
$\mathcal{N}(\Lambda\backslash R)=\bigvee$—fusion with an empty path results in no match.
$\mathcal{N}(R\backslash\Lambda)=\bigvee$—fusion with an empty path results in no match.
$\mathcal{N}((R|\Lambda)\backslash S)=R\backslash S$.
$\mathcal{N}(R\backslash S|\Lambda))=R\backslash S$.
$\mathcal{N}(R\backslash S)=R\backslash S$.
$\mathcal{N}(\bigvee^{+})=\bigvee$.
$\mathcal{N}(!^{+})=\Lambda$.
$\mathcal{N}((R|\Lambda)^{+})=R^{+}|\Lambda$.
$\mathcal{N}(R^{+})=R^{+}$.
$\mathcal{N}(\bigvee|R)=R$.
$\mathcal{N}(R|\bigvee)=R$.
$\mathcal{N}(\Lambda|R)=R|\Lambda$.
$\mathcal{N}(R|\Lambda)=R|\Lambda$.
$\mathcal{N}((R|\Lambda)|S)=\mathcal{N}(R|S)|\Lambda$.
$\mathcal{N}(R|(S|\Lambda))=(R|S)|\Lambda$.
$\mathcal{N}(R|S)=R|S$.
$\mathcal{N}(\bigvee\&R)=\bigvee$.
$\mathcal{N}(R\&\bigvee)=\bigvee$.
$\mathcal{N}(\Lambda\&\Lambda)=\Lambda$.
$\mathcal{N}(R\&\Lambda)=\bigvee$.
$\mathcal{N}(\Lambda\&R)=\bigvee$.
$\mathcal{N}(\Lambda\&(R|\Lambda))=\Lambda$.
$\mathcal{N}((R|\Lambda)\&\Lambda)=\Lambda$.
$\mathcal{N}(R\&(S|\Lambda))=R\&S$.
$\mathcal{N}((R|\Lambda)\&S)=R\&S$.
$\mathcal{N}((R|\Lambda)\&(S|\Lambda))=(R\&S)|\Lambda$.
$\mathcal{N}(R\&S)=R\&S$.
$\mathcal{N}(fj(\ldots,\bot,\ldots))=\bot$.
$\mathcal{N}(fj(\ldots,\Lambda,\ldots)=\bot$.
$\mathcal{N}(fj(\ldots,R|\Lambda,\ldots)=\bot$.
$\mathcal{N}(fj(R,S,\ldots))=fj(R,S,\ldots)$.
$\mathcal{N}(\bot\times R)=\bot$.
$\mathcal{N}(R\times\bot)=\bot$.
$\mathcal{N}(\Lambda\times\Lambda)=\Lambda$.
$\mathcal{N}(R\times\Lambda)=\bot$.
$\mathcal{N}(\Lambda\times R)=\bot$.
$\mathcal{N}(\Lambda\times(R|\Lambda))=\Lambda$.
$\mathcal{N}((R|\Lambda)\times\Lambda)=\Lambda$.
$\mathcal{N}(R\times(S|\Lambda))=R\times S$.
$\mathcal{N}((R|\Lambda)\times S)=R\times S$.
$\mathcal{N}((R|\Lambda)\times(S|\Lambda))=(R\times S)|\Lambda$.
$\mathcal{N}(R\times S)=R\times S$.

For example, $\mathcal{N}((a^{*}|b)c)=\mathcal{N}(((a^{+}|\Lambda)|b)c)=\mathcal{N}(((a^{+}|b)|\Lambda)c)=((a^{+}|b)c)|c$. The result of the transformation $\mathcal{N}(R)$ may be referred to as the normal form of ERE R. The normal form of ERE R may improve performance (i.e., reduce the amount of processor cycles used for matching) because it may avoid or substantially reduce matching an ERE with an empty sequence of letters. Normalization is optional, i.e., embodiments described herein may also be used with EREs that are not normalized.

Converting ERE into SVA Sequence

In the following discussion, it may be assumed that R, S and T are ERE in the normal form. However, embodiments described herein are also applicable to EREs that have not been normalized. If $R=\bot$, then R has no match on any graph, if $R=\Lambda$ or $R=S|\Lambda$, then R is trivially matched on any graph. Therefore, it is assumed that no subexpression of R admits an empty match.

ERE may be translated into an SVA sequence recursively. Each ERE subexpression is translated into SVA sequence along with a set of local variables. The recursive translation process may be described in the terms of the DAG representation and the reduction actions described earlier. The identifier of the current vertex is denoted by ν. It is assumed that the graph G has a single source (root) vertex. Otherwise, it is always possible to introduce a fresh dummy root vertex and connect it to all the originals source vertices of G.

Transformation of ERE T into SVA sequence ERE T into SVA sequence $\mathcal{T}(p, M, T)$ has the following additional arguments:

p is a local variable containing the identifier of the predecessor vertex.

M is a set of visited nodes.

The top-level ERE T is transformed as $\mathcal{T}(p, \lambda, T)$, where p is a fresh local variable to contain a vertex ID, and no set of visited nodes is allocated. F or arbitrary T, $\mathcal{T}(p, M, T)$ is defined as follows.

1. T=x: $\mathcal{T}$(p,M,T)=($\ell$(ν)==x,p=ν, $\mathscr{r}$(M,ν)).
2. T=.: $\mathcal{T}$(p, M, T)=(1, p=ν, $\mathscr{r}$(M, ν)).
3. T=R\S: $\mathcal{T}$(p, M, T)=($\mathcal{T}$(p, M, R) ##[+] e(p, ν) ##0 $\mathcal{T}$(p, M, S)).
4. T=R|S: $\mathcal{T}$(p,M,T)=($\mathcal{T}$(p,M,R) ##0 $\mathcal{T}$(p, M, S)).
5. T=R$^{+}$: $\mathcal{T}$(p,M,T)=($\mathcal{T}$(p, M, R) ##1 (##[*]e(p,ν) ##0 $\mathcal{T}$(p, M, R))[*]).
6. T=R|S: $\mathcal{T}$(p, M, R|S)=($\mathcal{T}$(p,M,R) or $\mathcal{T}$(p,M,S)).
7. T=R&S.
   $\mathcal{T}$(p, λ, T)=((1, α(L), α(M), α(N), p=ν) ##0 ((##[+] e(p, ν), p=ν, $\mathscr{r}$(ν, L)) [*] intersect $\mathcal{T}$(r, M, R) intersect $\mathcal{T}$(s, N, S)) ##0 M⊂L && N⊂L).
   $\mathcal{T}$(p, M, T)=($\mathcal{T}$(p, M, R) intersect $\mathcal{T}$(p, M, S)), where M≠λ.
8. T=fj(R,S, . . . ): $\mathcal{T}$(p,M,T)=((1,p=ν, $\mathscr{r}$(M,ν))##1(##[*](e(p,ν),r1=ν,r2=ν)##0$\mathcal{T}$(r2,λ,R)##[+]e(r2,ν]) intersect (##[*](e(p,ν),s1=ν,s2=ν)##0 $\mathcal{T}$(s2,λ,S)##[+]e(s2,ν)) intersect . . . )##0(!c(r1,s2)&&!c(s1,r2)&& ν, $\mathscr{r}$(M,ν))).
9. T=R×S: $\mathcal{T}$(p,M,T)=((1,s=p, $\mathscr{r}$ M,ν)##0($\mathcal{T}$(p,λ,R) intersect $\mathcal{T}$(s,λ,S))##0(1, $\mathscr{r}$(M,ν)).

Regarding generating sequence action items, if the result of the action items is not used, then the action items may he eliminated. For example, if x is the last letter in the original ERE. then its transformation may be written as simple as $\mathcal{T}$(p,M,x)=($\ell$)(ν)==x).

The transformations shown above may be explained as follows. Given a chain of vertices (cases 3 and 5), it may be checked that each vertex in the chain is directly connected with its predecessor. For example, for the DAG 1100 shown in FIG. 11, vertex 1 is directly connected to vertex 0 and vertex 3 is directly connected to vertex 1, which implies that ERE abe is matched on this graph.

For a fork join operator the following may be checked: all component paths converge, and all components, except of their fork and join points, are concurrent. Specifically, for checking concurrency, it may be checked that there is no path between the vertex following the fork point of one path to the vertex preceding the join point of any other path.

For the sequential intersection it may be checked that the component paths converge and that the vertices of one path and the vertices of the other path belong to the first path (excluding the points where concurrent paths are split by fork join or by general intersection operators). For this purpose, the additional path between the initial and the final points is introduced (it may coincide with one of the original paths) and all vertices along this path are collected in the vertex set L. The relevant vertices of the component paths are collected into vertex sets M and N, correspondingly. At the intersection point it is then checked that M c L and N c L. This check is to be done only for those sequential intersection ERE which are not parts of other sequential intersections ERE, unless there are fork join or general intersect operators within them.

For the general intersection it may be sufficient to check that the component ERE define converging paths and, if required, add the initial and the final node of the intersection to the set. No additional checks are required for the disjunction operator. The following examples illustrate the above transformations for the DAG 1100 in FIG. 11.

Figure 14:
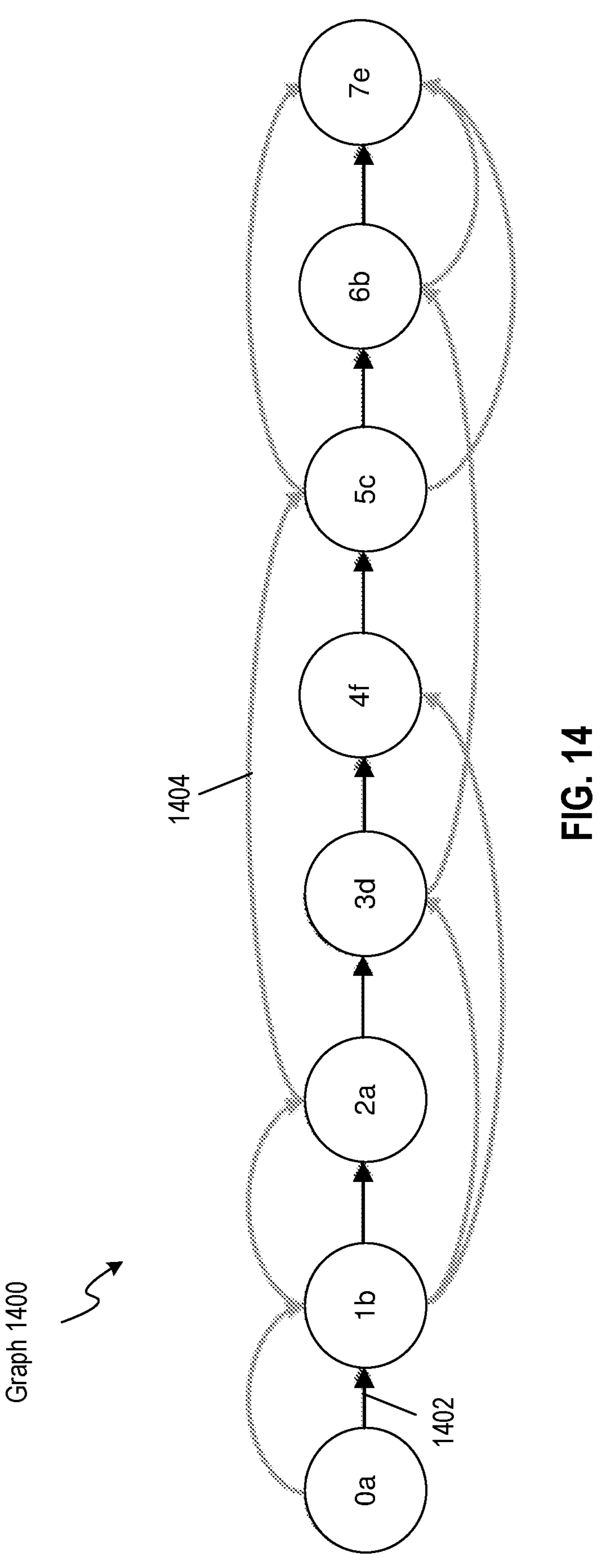
FIG. 14 illustrates the graph shown in FIG. 11 as a linear sequence of its vertices in accordance with some embodiments described herein.

FIG. 14 illustrates the graph shown in FIG. 11 as a linear sequence of its vertices in accordance with some embodiments described herein.

Graph 1400 shows a linear sequence of vertices and includes the same vertices as DAG 1100. For example, the vertex "Oa" corresponds to vertex with identifier "0" and label "a" which is shown in DAG 1100 as "a (0)." The straight edges between vertices (e.g., edge 1402) in the linear sequence correspond to the order in which the vertices are traversed. The curved edges (e.g., edge 1404) correspond to the edges in DAG 1100 between the vertices.

The first example considers the transformation of ERE bd. The following cover property may be created based on the ERE.

```
sequence T;
  int p;
  (label[v] == b, p = v) ##[+] label[v] == d && adj[p][v];
endsequence : T
cover property (@(posedge clk) T);
```

The sequence T defined above looks for a vertex labeled b and an adjacent vertex labeled d. Sequence T matches the sequence of vertices with identifiers 1, 2, and 3 (in that order) in graph 1400, where vertices with identifiers 1 and 3 belong to the path. The cover property shown above checks if sequence T has been matched in each clock edge.

The second example considers the transformation of ERE fj (ac, db). The following cover property may be created based on the ERE.

```
sequence R(p);
  (label[v] == a, p = v) ##[+] (label[v] == c && adj[p][v], p = v);
endsequence : R
sequence S(p);
  (label[v] == e, p = v) ##[+] (label[v] == b && adj[p][v], p = v);
endsequence : S
sequence T;
  int p, r1, r2, s1, s2;
  (1, p = v) ##1 (
    (##[*] (adj[p][v], r1 = v) ##0 R(r2) ##[+] adj[r2][v])
    intersect
    (##[*] (adj[p][v], s1 = v) ##0 S(s2) ##[+] adj[s2][v])
  ) ##0 (!conn[r1][s2] && !conn[s1][r2]);
endsequence : T
cover property (@(posedge clk) T);
```

Sequence T defined above looks for some vertex from which there are paths ad and eb converging in another vertex such that there is no path from a vertex labeled a to a vertex labeled b, and no path from a vertex labeled e to a vertex labeled d. Sequence T matches the sequence of vertices with identifiers 1, 2, 3, 4, 5, 6, and 7 (in that order) in graph 1400, where the vertex with identifier 1 is the fork point, and the vertex with identifier 7 is the join point. The cover property shown above checks if sequence T has been matched in each clock edge.

The third example considers the transformation of ERE (.+a.$^+$) x (.$^+$b.$^+$). The following cover property may be created based on the ERE.

```
sequence R;
  int p;
  ((1, p = v) ##1 (##[*] adj[p][v] ##0 (1, p = v))[*])
  ##[+] adj[p][v] ##0 (label[v] == a, p = v)
  ##[+] adj[p][v] ##0 ((1, p = v) ##1 (##[*] adj[p][v] ##0 (1, p = v))[*]);
endsequence : R
sequence S;
  int s;
  ((1, s = v) ##1 (##[*] adj[s][v] ##0 (1, s = v))[*])
  ##[+] adj[s][v] ##0 (label[v] == b, s = v)
  ##[+] adj[s][v] ##0 ((1, s = v) ##1 (##[*] adj[s][v] ##0 (1, s = v))[*]);
endsequence : S
sequence T;
  int p, s;
  R intersect S;
endsequence : T
cover property (@(posedge clk) T);
```

The resulting sequence looks for the intersection of two arbitrary paths, one—containing a vertex labeled a, and the other—a vertex labeled b. Matching vertex identifier sequences include a first sequence 0, 1, 2, 3, 4, and 5, and a second sequence 1, 2, 3, 4, 5, 6, and 7. In the first sequence, vertex with identifier 1 is labeled b and vertex with identifier 2 is labeled with a and belong to the same path which passes through vertex identifiers 1, 2, and 5. In the second sequence, vertex with identifier 2 is labeled a and vertex with identifier 6 is labeled b and belong to converging paths "1, 2, 5, 7" and "1, 3, 6, 7," respectively. The cover property shown above checks if sequence T has been matched in each clock edge.

The fourth example considers the transformation of ERE (.$^+$a.+)&(.$^+$b.$^+$). The following cover property may be created based on the ERE.

```
sequence R(M);
  int r;
  ((1, r = v) ##1 (##[*] adj[r][v] ##0 (1, r = v, M |= 1 << v))[*])
  ##[+] adj[r][v] ##0 (label[v] == a, r=v, M |= 1 << v)
  ##[+] adj[r][v]
  ##0 ((1, r=v, M |= 1 << v) ##1 (##[*] adj[r][v] ##0 (1, r=v, M |= 1 <<
v))[*]);
endsequence : R
sequence S(N);
  int s;
  ((1, s = v) ##1 (##[*] adj[s][v] ##0 (1, s=v, N |= 1 << v))[*])
  ##[+] adj[s][v] ##0 (label[v] == b, s=v, N |= 1 << v)
  ##[+] adj[s][v]
  ##0 ((1, s=v, N |= 1 << v) ##1 (##[*] adj[s][v] ##0 (1, s=v, N |= 1 <<
v))[*]);
endsequence : S
sequence T;
  int p, r, s;
  bit [7:0] L, M, N;
  (1, p = v, L = 0, M = 0, N = 0)
  ##0
  ((##[1:$] (adj[p][v], p=v, L |= 1 << v)[*1:$]) intersect R(M) intersect
S(N))
  ##0
  (M & L) == M && (N & L) == N;
endsequence : T
cover property (@(posedge clk) T);
```

The resulting sequence looks for a path matching both ERE (.$^+$a.$^+$) and (.$^+$b.$^+$). The corresponding vertex identifier sequence which matches is 0, 1, 2, 3, 4, and 5. The cover property shown above checks if sequence T has been matched in each clock edge.

Optimizations,

Limiting Search Depth Optimization

In some transformations, such as the transformation of ERE concatenation, an unbounded search for adjacent vertices may exist:

$$T = RS : \mathcal{T}(p, M, T) = \mathcal{T}(p, M, R)\#\#[+]e(p, v)\#\#0\mathcal{T}(p, M, S).$$

For example, during ERE be matching on the graph shown in FIG. 14 when vertex ν=1 (see Example 1 from the previous section), the search will continue until the end (ν=7), because this ERE cannot be matched on this graph. However, the vertex adjacent to 1, with the maximal ID, is 4, and there is no need to examine vertices 5, 6 and 7. It is possible to limit the search depth by introducing the maximal search bound for each vertex, equal to the maximal ID of its adjacent vertices. Let function $m(\nu)$ return this maximal ID. Then the transformation for the concatenation may be updated as follows:

$$T = RS : \mathcal{T}(p, M, T) = \mathcal{T}(p, M, R)\#\#1 v < m(p)[*]\#\#1 e(p, v)\#\#0\mathcal{T}(p, M, S).$$

Other transformations checking the vertex adjacency may be updated the similar way. This information is readily available from the adjacency matrix or list and may be stored in a vector. For example, for graph 1400 in FIG. 14, the vector can be defined as follows:

```
int ub[] = '{1, 4, 5, 6, 4, 7, 7, 7};
```

and the updated transformation from Example 1 shown above has the form:

```
(label[v] == b, p = v)##1 v < ub[p] * ##1 label[v] == e && adj[p, v];
```

Graph Reduction Optimization

If all individual letters $x \in \Sigma$ in an ERE appear only with the first occurrence operator, $x^1$, and the ERE does not contain fj operators, unless these fj expressions are fused at the beginning and the end with non-fj expressions, then the graph may be reduced (the reason why a standalone fj expression does not allow this reduction is because their fork and join nodes are essentially dots—any letter). If the outermost ERE operator is a concatenation, the first operand of this concatenation does not have to have the first occurrence operator associated with it, because the top-level ERE xR, where R is an ERE, is equivalent to $x^1R$.

Given an ERE in the first occurrence form $\varepsilon(x_1, x_2, \ldots, x_n)$ dependent only on letters $x_1, x_2, \ldots, x_n$, the original DAG G may be reduced to DAG G' whose vertices are exactly the vertices of G, labeled $x_1, x_2, \ldots, x_n$, and there is an edge from vertex ν to vertex w in G' iff there is a path from ν to w in G, containing no vertices from G' (this includes the case when there is an edge (ν, w) in G). ERE ε may then be checked on a smaller graph G' instead of G.

Figure 15:
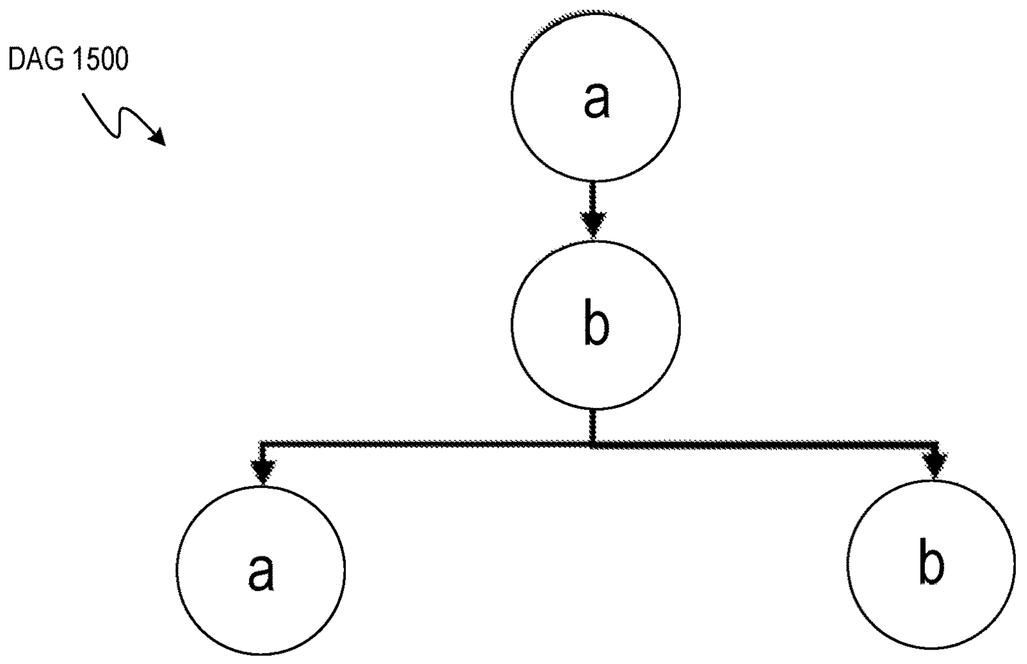
FIG. 15 illustrates a reduced graph in accordance with some embodiments described herein.

FIG. 15 illustrates a reduced graph in accordance with some embodiments described herein.

DAG 1500 may be created based on DAG 100 shown in FIG. 1. For example, it is sufficient to match ERE $ab^1$ on DAG 1500 instead of DAG 100 shown in FIG. 1.

If the ERE meets the above conditions except of the absence of the non-fused fj expressions, then the optimization is still possible but all branch fork and join vertices should be kept in the reduced graph.

Figure 16:
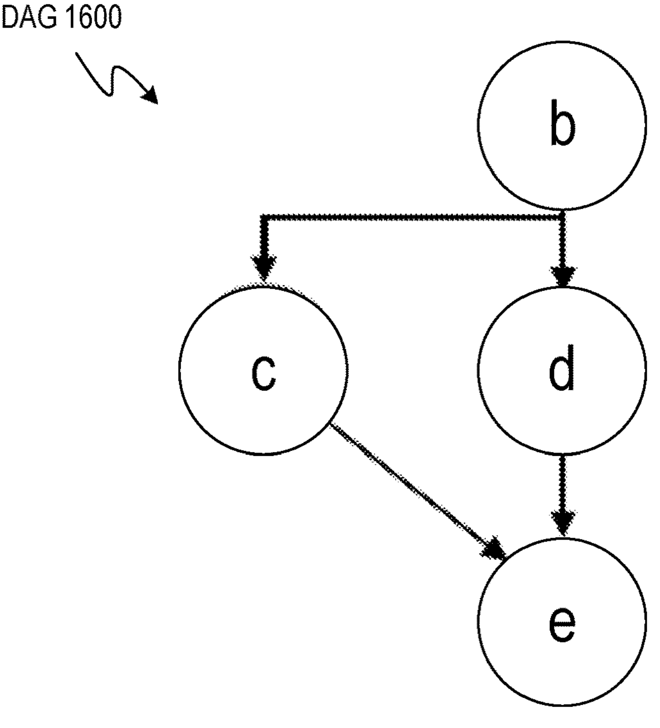
FIG. 16 illustrates a reduced graph for ERE $f_j$ (.*c.*,.*d.*) in accordance with some embodiments described herein.

FIG. 16 illustrates a reduced graph for ERE fj (.*c.*, .*d.*) in accordance with some embodiments described herein. Specifically, DAG 1600 may be created as a reduced graph for ERE fj (.*c.*, .*d.*).

Handling Multiple DAGs

Sometimes it is required to check that an ERE can be matched at least on one of multiple DAGs. For example, this is relevant for PSS coverage checking on multiple generated scenarios. It is, of course, possible to start a new simulation session for each DAG, but simulation initializations and shut down may significantly slowdown ERE checks. It is possible to combine several DAGs into one simulation session. To do this, some embodiments described herein may add a new dummy sink vertex for each graph and connect all sink vertices of the corresponding graph to it.

Figure 17:
FIG. 17 illustrates using dummy sink vertices to combine several DAGs into one simulation session in accordance with some embodiments described herein.
Figure 17:
Figure 17:
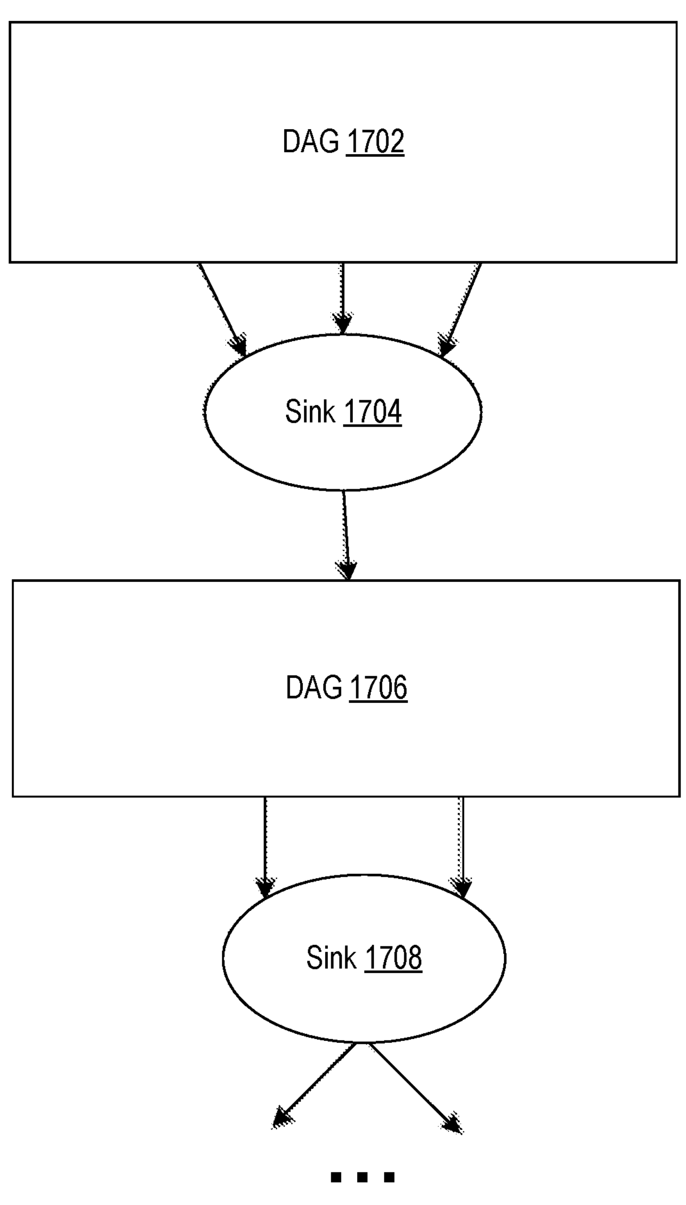

FIG. 17 illustrates using dummy sink vertices to combine several DAGs into one simulation session in accordance with some embodiments described herein.

For example, DAG 1702 may represent a first set of generated scenarios, and DAG 1706 may represent a second set of generated scenarios. A single DAG 1700 may be created by linking DAG 1702 and DAG 1706 using dummy sink nodes 1704 and 1708.

For example, in DAG 1100 in FIG. 11, consider the incoming edges to the sink node exit from vertices with identifiers 4 and 7. If the original SVA statement is cover property (@(posedge clk) T);

then the modified SVA statement to handle multiple graphs may be:

cover property (@(posedge clk) disable if ($sampled (issink(ν))) T); where "issink" is a function checking that the vertex ν is a sink node. This change assures that each ERE is completely matched on the same graph.

The construction may be slightly modified to report ERE matches for each DAG. It is sufficient to associate with each vertex the graph identifier and to use SVA action block mechanism for reporting. Let function report(ν) report or register in a database a successful match along with the DAG ID on vertex v. Then the following SVA statement may be used for the match reporting:

```
cover property (@(posedgeclk) disable if ($sampled
    (issink(v))) T) report($sampled(v));
```

Process for ERE Matching in a DAG by Using Assertion Simulation

Figure 18:
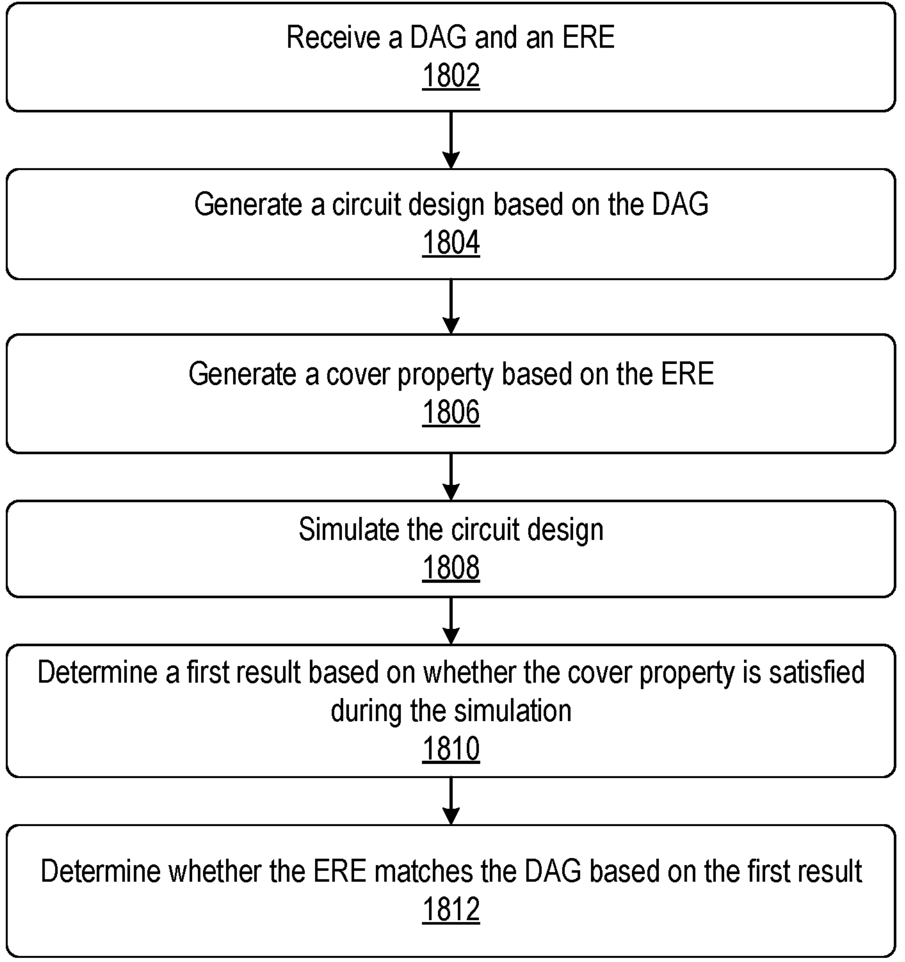
FIG. 18 illustrates a process for ERE matching in a DAG in accordance with some embodiments described herein.

FIG. 18 illustrates a process for ERE matching in a DAG in accordance with some embodiments described herein.

A DAG and an ERE may be received (at 1802). The DAG (e.g., see FIG. 1) may include a set of vertices and a set of directed edges, where each directed edge in the set of directed edges connects two vertices in the set of vertices, and where each vertex in the set of vertices is associated with a letter selected from a set of letters. The ERE may specify a set of sequences of letters selected from the set of letters.

In some embodiments described herein, the DAG and ERE may be generated based on a technological problem that is desired to be solved. Specifically, the DAG may represent one or more sets of scenarios which were generated for verifying or testing a system, and where the ERE may represent a set of scenarios which is desired to be covered for verifying or testing the system.

A circuit design may be generated based on the DAG (at 1804). Generating the circuit design based on the DAG may include associating a set of identifiers with the set of vertices based on a topological sorting of the set of vertices in the DAG, and creating a vector of signals in the circuit design, wherein the vector of signals is indexed by the set of identifiers, and wherein signal values of the vector of signals correspond to the set of letters. For example, the vertices in FIG. 11 are associated with identifiers, and in the section "DAG Representation," the vector "label[ ]" is created which is indexed by the set of identifiers.

Generating the circuit design based on the DAG may include creating a clock, and creating a counter, wherein a value of the counter is incremented at each clock edge of the clock. For example, in the section "DAG Representation," clock "clk" is created and a counter is created using the statement "v<=v+1;".

A cover property may be generated based on the ERE (at 1806). Generating the cover property based on the ERE may include creating a logical statement which is defined over a set of signals corresponding to the set of letters, where the logical statement evaluates to a true value when a signal trace corresponding to a sequence of letters in the set of sequences of letters is detected during the simulating the circuit design.

For example, each cover property statement in the code shown in the second "Converting ERE into SVA Sequence" specifies a logical statement which evaluates to a true value when a signal trace corresponding to a sequence of letters in the set of sequences of letters is detected during the simulating the circuit design.

The circuit design may be simulated (at 1808). The circuit simulation may generate signal traces which correspond to sequences of letters along paths in the DAG. The circuit simulation may be performed by an HDL simulator which supports a RTL, e.g., a SystemVerilog simulator.

A first result may be determined based on whether the cover property is satisfied during the simulation (at 1810). Specifically, the first result may indicate whether the cover property was satisfied during the simulation. It may be determined whether the ERE matches the DAG based on the first result (at 1812). Specifically, if the first result indicates that the cover property was satisfied during the simulation, then it may be determined that the ERE matches the DAG. On the other hand, if the first result indicates that the cover property was not satisfied during the simulation, then it may be determined that the ERE does not match the DAG.

In some embodiments, the technological problem based on which the DAG and the ERE were generated may then be solved based on whether the ERE matched the DAG. For example, suppose the DAG represents a first set of scenarios which are generated during verification and/or testing of a system, and the ERE represents a set of scenarios that are desired to be covered during verification and/or testing of the system. If the ERE matches the DAG, then it may indicate the set of scenarios that were generated during verification and/or testing cover the set of scenarios that were desired to be covered.

Figure 19:
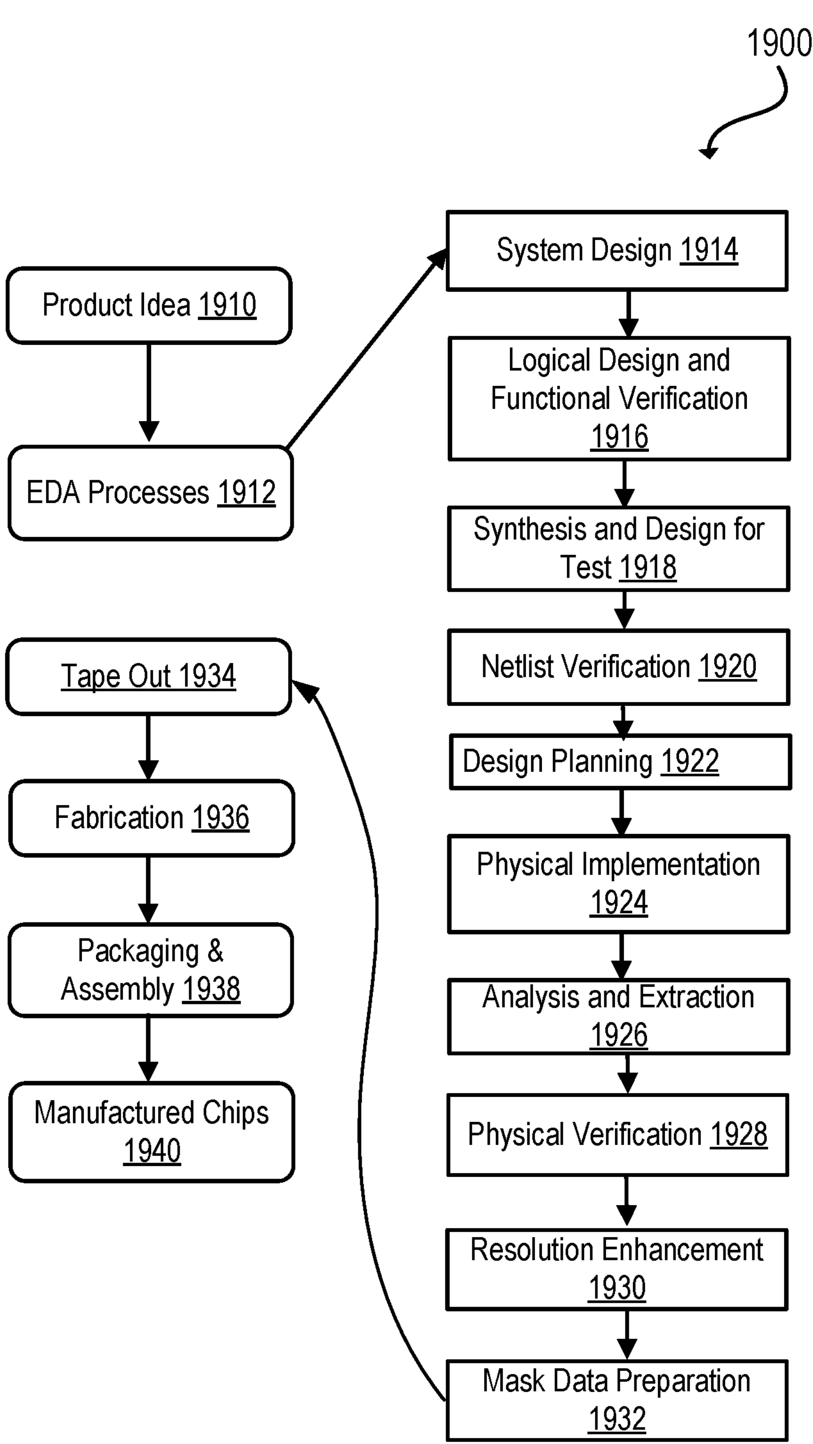
FIG. 19 illustrates an example flow for the design, verification, and fabrication of an integrated circuit in accordance with some embodiments described herein.

FIG. 19 illustrates an example flow 1900 for the design, verification, and fabrication of an integrated circuit in accordance with some embodiments described herein. EDA processes 1912 (the acronym "EDA" refers to "Electronic Design Automation") can be used to transform and verify design data and instructions that represent the integrated circuit. Each of these processes can be structured and enabled as multiple modules or operations.

Flow 1900 can start with the creation of a product idea 1910 with information supplied by a designer, information which is transformed and verified by using EDA processes 1912. When the design is finalized, the design is taped-out 1934, which is when artwork (e.g., geometric patterns) for the integrated circuit is sent to a fabrication facility to manufacture the mask set, which is then used to manufacture the integrated circuit. After tape-out, a semiconductor die is fabricated 1936 and packaging and assembly 1938 are performed to produce the manufactured IC chip 1940.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 1914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as emulators' or prototyping systems' are used to speed up the functional verification.

During synthesis and design for test 1918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1920, the netlist is checked for compliance with timing constraints and for correspondence with the HDL code. During design planning 1922, an overall floor plan for the integrated circuit is constructed and analyzed for timing and top-level routing.

During layout or physical implementation 1924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1926, the circuit function is verified at the layout level, which permits refinement of the layout design. During physical verification 1928, the layout design is checked to ensure that manufacturing constraints are correct, such as DRC constraints, electrical constraints, lithographic constraints, and that circuitry function matches the HDL design specification. During resolution enhancement 1930, the geometry of the layout is transformed to improve how the circuit design is manufactured.

During tape-out, data is created to be used (after lithographic enhancements are applied if appropriate) for production of lithography masks. During mask data preparation 1932, the 'tape-out' data is used to produce lithography masks that are used to produce finished integrated circuits.

A storage subsystem of a computer system (such as computer system 2000 of FIG. 20) may be used to store the programs and data structures that are used by some or all of the EDA products described herein, and products used for development of cells for the library and for physical and logical design that use the library.

Figure 20:
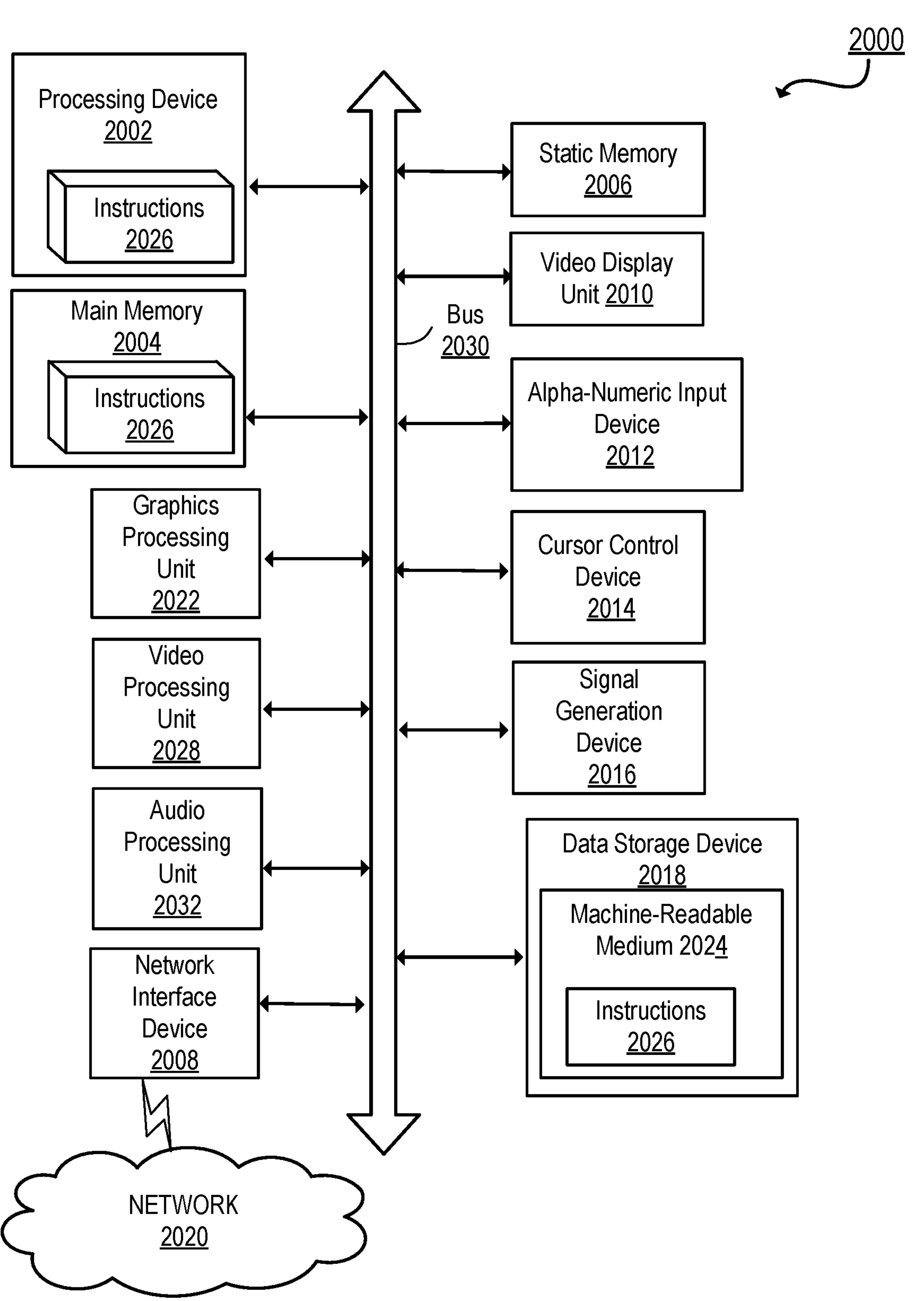
FIG. 20 illustrates an example machine of a computer system within which a set of instructions, for causing the machine to perform any one or more of the methodologies discussed herein, may be executed.

FIG. 20 illustrates an example machine of a computer system 2000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2000 includes a processing device 2002, a main memory 2004 (e.g., read-only memory (ROM), flash memory, dynamic random access memory (DRAM) such as synchronous DRAM (SDRAM), a static memory 2006 (e.g., flash memory, static random access memory (SRAM), etc.), and a data storage device 2018, which communicate with each other via a bus 2030.

Processing device 2002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 2002 may also be one or more special-purpose processing devices such as an application specific integrated circuit (ASIC), a field programmable gate array (FPGA), a digital signal processor (DSP), network processor, or the like. The processing device 2002 may be configured to execute instructions 2026 for performing the operations and steps described herein.

The computer system 2000 may further include a network interface device 2008 to communicate over the network 2020. The computer system 2000 also may include a video display unit 2010 (e.g., a liquid crystal display (LCD) or a cathode ray tube (CRT)), an alphanumeric input device 2012 (e.g., a keyboard), a cursor control device 2014 (e.g., a mouse), a graphics processing unit 2022, a signal generation device 2016 (e.g., a speaker), graphics processing unit 2022, video processing unit 2028, and audio processing unit 2032.

The data storage device 2018 may include a machine-readable storage medium 2024 (also known as a non-transitory computer-readable medium) on which is stored one or more sets of instructions 2026 or software embodying any one or more of the methodologies or functions described herein. The instructions 2026 may also reside, completely or at least partially, within the main memory 2004 and/or within the processing device 2002 during execution thereof by the computer system 2000, the main memory 2004 and the processing device 2002 also constituting machine-readable storage media.

In some implementations, the instructions 2026 include instructions to implement functionality corresponding to the present disclosure. While the machine-readable storage medium 2024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 2002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

receiving a directed acyclic graph (DAG) and an extended regular expression (ERE);

generating a circuit design based on the DAG;

generating a cover property based on the ERE, wherein the cover property is a logical statement which is defined over a set of signals in the circuit design;

simulating, by a processing device, the circuit design;

determining a first result based on whether the cover property is satisfied during the simulation of the circuit design; and determining whether the ERE matches a path in the DAG based on the first result.

2. The method of claim 1, wherein the DAG includes a set of vertices and a set of directed edges, wherein each directed edge in the set of directed edges connects two vertices in the set of vertices, and wherein each vertex in the set of vertices is associated with a letter selected from a set of letters.

3. The method of claim 2, wherein the ERE specifies a set of sequences of letters selected from the set of letters.

4. The method of claim 3, wherein the set of signals corresponds to the set of letters, wherein the logical statement evaluates to a true value when a signal trace corresponding to a sequence of letters in the set of sequences of letters is detected during the simulation of the circuit design.

5. The method of claim 2, wherein generating the circuit design based on the DAG comprises:

associating a set of identifiers with the set of vertices based on a topological sorting of the set of vertices in the DAG; and creating a vector of signals in the circuit design, wherein the vector of signals is indexed by the set of identifiers, and wherein signal values of the vector of signals correspond to the set of letters.

6. The method of claim 5, wherein generating the circuit design based on the DAG comprises:

creating a clock; and creating a counter, wherein a value of the counter is incremented at each clock edge of the clock.

7. The method of claim 1, wherein simulating the circuit design generates signal traces which correspond to sequences of letters along paths in the DAG.

8. The method of claim 1, further comprising transforming the ERE, wherein the transforming the ERE improves performance of the simulation of the circuit design.

9. The method of claim 1, wherein the DAG represents a first set of scenarios which was generated for verifying or testing a system, and wherein the ERE represents a second set of scenarios which is desired to be covered for verifying or testing the system.

10. The method of claim 1, wherein the DAG represents multiple sets of scenarios which were generated for verifying or testing a system, and wherein the ERE represents a set of scenarios which is desired to be covered for verifying or testing the system.

11. A non-transitory computer readable storage medium storing instructions, which when executed by a processing device, cause the processing device to:

receive a directed acyclic graph (DAG) and an extended regular expression (ERE);

generate a circuit design based on the DAG;

generate a cover property based on the ERE, wherein the cover property is a logical statement which is defined over a set of signals in the circuit design;

simulate the circuit design;

determine a first result based on whether the cover property is satisfied during the simulation of the circuit design; and determine whether the ERE matches a path in the DAG based on the first result.

12. The non-transitory computer readable storage medium of claim 11, wherein the DAG includes a set of vertices and a set of directed edges, wherein each directed edge in the set of directed edges connects two vertices in the set of vertices, and wherein each vertex in the set of vertices is associated with a letter selected from a set of letters.

13. The non-transitory computer readable storage medium of claim 12, wherein the ERE specifies a set of sequences of letters selected from the set of letters.

14. The non-transitory computer readable storage medium of claim 13, wherein the set of signals corresponds to the set of letters, wherein the logical statement evaluates to a true value when a signal trace corresponding to a sequence of letters in the set of sequences of letters is detected during the simulation of the circuit design.

15. The non-transitory computer readable storage medium of claim 12, wherein generating the circuit design based on the DAG comprises:

associating a set of identifiers with the set of vertices based on a topological sorting of the set of vertices in the DAG; and creating a vector of signals in the circuit design, wherein the vector of signals is indexed by the set of identifiers, and wherein signal values of the vector of signals correspond to the set of letters.

16. The non-transitory computer readable storage medium of claim 15, wherein generating the circuit design based on the DAG comprises:

creating a clock; and creating a counter which increments a value at each edge of the clock.

17. The non-transitory computer readable storage medium of claim 11, wherein simulating the circuit design generates signal traces which correspond sequences of letters along paths in the DAG.

18. The non-transitory computer readable storage medium of claim 11, further comprising transforming the ERE, wherein the transforming the ERE improves performance of the simulation of the circuit design.

19. The non-transitory computer readable storage medium of claim 11, wherein the DAG represents one or more sets of scenarios which were generated for verifying or testing a system, and wherein the ERE represents a set of scenarios which is desired to be covered for verifying or testing the system.

20. An apparatus, comprising:

a memory storing instructions; and a processor, coupled with the memory and to execute the instructions, the instructions when executed causing the processor to:

receive a directed acyclic graph (DAG) and an extended regular expression (ERE), wherein the DAG represents one or more sets of scenarios which were generated for verifying or testing a system, and wherein the ERE represents a set of scenarios which is desired to be covered for verifying or testing the system;

generate a circuit design based on the DAG;

generate a cover property based on the ERE, wherein the cover property is a logical statement which is defined over a set of signals in the circuit design;

simulate the circuit design;

determine a first result based on whether the cover property is satisfied during the simulation of the circuit design; and determine whether the ERE matches a path in the DAG based on the first result.

* * * * *